(12) United States Patent
Jeong

(10) Patent No.: US 12,068,019 B2
(45) Date of Patent: *Aug. 20, 2024

(54) INTERNAL VOLTAGE GENERATION CIRCUIT AND SEMICONDUCTOR MEMORY APPARATUS INCLUDING THE SAME

(71) Applicant: SK hynix Inc., Icheon-si (KR)

(72) Inventor: Chan Hui Jeong, Icheon-si (KR)

(73) Assignee: SK hynix inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/322,409

(22) Filed: May 23, 2023

(65) Prior Publication Data

US 2023/0298656 A1    Sep. 21, 2023

Related U.S. Application Data

(63) Continuation of application No. 17/411,699, filed on Aug. 25, 2021, now Pat. No. 11,694,741.

(30) Foreign Application Priority Data

Apr. 12, 2021   (KR) ........................ 10-2021-0046990

(51) Int. Cl.
  *G11C 11/4072*    (2006.01)
  *G11C 11/4074*    (2006.01)
  (Continued)

(52) U.S. Cl.
  CPC ...... *G11C 11/4072* (2013.01); *G11C 11/4074* (2013.01); *G11C 11/4076* (2013.01); *G11C 11/4099* (2013.01)

(58) Field of Classification Search
  CPC ........... G11C 11/4072; G11C 11/4074; G11C 11/4076; G11C 11/4099; G11C 5/147; G11C 5/143; G11C 7/1042; G11C 7/04
  See application file for complete search history.

(56) References Cited

U.S. PATENT DOCUMENTS 8,004,352 B1 *  8/2011  Wang ................. H03K 19/0016
                                                          327/544
11,694,741 B2 *  7/2023  Jeong .................. G11C 11/4076
                                                          365/226

(Continued)

FOREIGN PATENT DOCUMENTS

KR    1020000008363 A    2/2000
KR    20100121826 A    11/2010
(Continued)

*Primary Examiner* — Sultana Begum
(74) *Attorney, Agent, or Firm* — William Park & Associates Ltd.

(57) ABSTRACT

An internal voltage generation circuit includes an enable control circuit configured to generate a final enable signal by limiting an activation time point of an enable signal to a point in time after a reset time, after the enable signal is inactivated. The internal voltage generation circuit also includes a start-up control circuit configured to perform a reset operation during the reset time and generate a start-up signal based on the final enable signal, a reference voltage generation circuit configured to generate a reference voltage based on the start-up signal, a current generation circuit configured to generate a reference current based on the reference voltage, and a voltage generation circuit configured to generate an internal voltage based on the reference current.

8 Claims, 9 Drawing Sheets

(51) Int. Cl.
   *G11C 11/4076*   (2006.01)
   *G11C 11/4099*   (2006.01)

(56) References Cited

U.S. PATENT DOCUMENTS

2010/0283516 A1* 11/2010 Choi ................... G11C 5/147
                                                        327/143
2016/0267988 A1*  9/2016 Ogawa ............... G11C 16/3459

FOREIGN PATENT DOCUMENTS

KR        101608218 B1    4/2016
KR       20160121204 A   10/2016

* cited by examiner

INTERNAL VOLTAGE GENERATION CIRCUIT AND SEMICONDUCTOR MEMORY APPARATUS INCLUDING THE SAME

CROSS-REFERENCES TO RELATED APPLICATION

The present application is a continuation application of U.S. patent application Ser. No. 17/411,699, filed on Aug. 25, 2021, and claims priority under 35 U.S.C. § 119(a) to Korean application number 10-2021-0046990, filed on Apr. 12, 2021, in the Korean Intellectual Property Office, which is incorporated herein by reference in its entirety.

BACKGROUND

1. Technical Field

Various embodiments generally relate to an internal voltage generation circuit and a semiconductor memory apparatus including the same, and more particularly, to an internal voltage generation circuit which can stably generate an internal voltage even though an active signal having a short inactive period is inputted, and a semiconductor memory apparatus including the same.

2. Related Art

In general, an integrated circuit including a semiconductor apparatus and a semiconductor memory apparatus receives an external supply voltage, and performs various circuit operations. The integrated circuit includes an internal voltage generation circuit mounted therein, the internal voltage generation circuit being configured to receive the external supply voltage and generate an internal voltage. Internal circuits of the integrated circuit perform various circuit operations substantially based on the internal voltage. Therefore, it is the most important for the integrated circuit to generate an internal voltage having a constant voltage level, in order to perform stable circuit operations.

In order to generate an internal voltage having a constant voltage level, a Widlar-type internal voltage generation circuit is employed. The Widlar-type internal voltage generation circuit may generate an internal voltage having a constant voltage level, even though an external supply voltage is changed by noise. With such advantages, however, the Widlar-type internal voltage generation circuit has several disadvantages.

First, the Widlar-type internal voltage generation circuit requires a relatively wide circuit area during circuit design.

The Widlar-type internal voltage generation circuit basically includes a voltage generation circuit for generating an internal voltage and a start-up circuit for controlling a start-up operation on the voltage generation circuit. The voltage generation circuit and the start-up circuit require a relatively large circuit area. A semiconductor memory apparatus which performs an interleaving operation on each plane region needs to include a Widlar-type internal voltage generation circuit for each plane. Therefore, the Widlar-type internal voltage generation circuit is a burden when the semiconductor memory apparatus is designed.

Second, the Widlar-type internal voltage generation circuit needs to guarantee a reset operation time for the start-up circuit.

The Widlar-type internal voltage generation circuit includes a start-up circuit. The start-up circuit requires a reset operation for a predetermined reset time, due to the circuit characteristics thereof. The start-up circuit basically generates a start-up signal including an enable pulse based on an enable signal. The start-up signal is a signal for controlling the start-up operation on the voltage generation circuit. However, when the enable signal is activated again while the reset time is not guaranteed after the enable signal was inactivated, the start-up circuit generates the start-up signal including no enable pulse. Therefore, the voltage generation circuit is enabled after being disabled based on the enable signal, but does not perform the start-up operation according to the start-up signal including no enable pulse. As a result, the voltage generation circuit does not generate a stable internal voltage.

Therefore, the Widlar-type internal voltage generation circuit accompanies difficulties during circuit design, due to the two above-described problems.

SUMMARY

In an embodiment, an internal voltage generation circuit may include: an enable control circuit configured to generate a final enable signal by limiting an activation time point of an enable signal to a point in time after a reset time, after the enable signal is inactivated; a start-up control circuit configured to perform a reset operation during the reset time, and generate a start-up signal based on the final enable signal; a reference voltage generation circuit configured to generate a reference voltage based on the start-up signal; a current generation circuit configured to generate a reference current based on the reference voltage; and a voltage generation circuit configured to generate an internal voltage based on the reference current.

In an embodiment, a semiconductor memory apparatus may include: a plurality of plane regions each including a memory bank; an enable control circuit configured to generate a final enable signal by limiting an activation time point of an enable signal to a point in time after a reset time, after the enable signal is inactivated; a start-up control circuit configured to perform a reset operation during the reset time, and generate a start-up signal based on the final enable signal; a reference voltage generation circuit configured to generate a reference voltage based on the start-up signal; a current generation circuit configured to generate at least one reference current based on the reference voltage; and a plurality of voltage generation circuits corresponding to the plurality of plane regions, respectively, and configured to generate a plurality of internal voltages based on the at least one reference current.

DETAILED DESCRIPTION

The description of the present disclosure is merely an embodiment for a structural and/or functional description. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the terms that are described in this application should be understood as follows.

The terms, such as the "first" and the "second," are used to distinguish one element from another element, and the scope of the present disclosure should not be limited by the terms. For example, a first element may be named a second element. Likewise, the second element may be named the first element.

An expression of the singular number should be understood as including plural expressions, unless clearly expressed otherwise in the context. The terms, such as "include" or "have," should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of the steps, symbols (e.g., a, b, and c) are used for convenience of description, and the symbols do not describe an order of the steps. The steps may be performed in an order different from the order described in the context unless a specific order is clearly described in the context. That is, the steps may be performed according to a described order, may be performed substantially at the same time as the described order, or may be performed in reverse order of the described order.

All the terms used herein, including technological or scientific terms, have the same meanings as those that are typically understood by those skilled in the art, unless otherwise defined. Terms defined in commonly used dictionaries should be construed as with the same meanings as those in the context in related technology and should not be construed as with ideal or excessively formal meanings, unless clearly defined in the application.

Various embodiments are directed to an internal voltage generation circuit capable of generating an internal voltage based on a final enable signal which provides a reset time.

Various embodiments are directed to a semiconductor memory apparatus including an internal voltage generation circuit capable of generating internal voltages corresponding to a plurality of plane regions, respectively.

Figure 1:
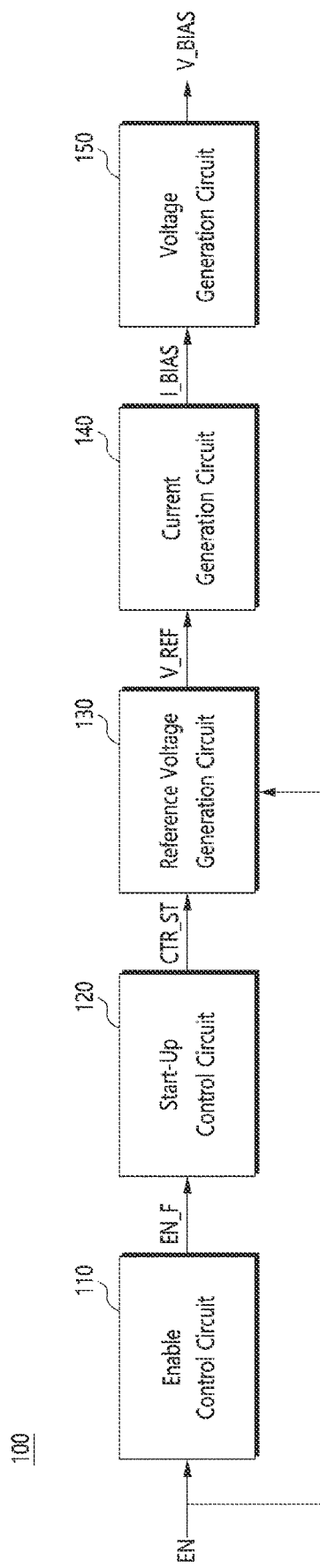
FIG. 1 is a block diagram illustrating a configuration of an internal voltage generation circuit, in accordance with an embodiment.

FIG. 1 is a block diagram illustrating a configuration of an internal voltage generation circuit 100, in accordance with an embodiment.

Referring to FIG. 1, the internal voltage generation circuit 100 may include an enable control circuit 110, a start-up control circuit 120, a reference voltage generation circuit 130, a current generation circuit 140, and a voltage generation circuit 150.

The enable control circuit 110 may be configured to generate a final enable signal EN_F by limiting an activation time point of an enable signal EN to a time point after a reset time, after the enable signal EN is inactivated. The enable signal EN may be a signal for controlling an enable operation of the internal voltage generation circuit 100. The reset time may indicate the time required for a reset operation of the start-up control circuit 120 which will be described below. The more detailed circuit configuration and operation of the enable control circuit 110 will be described with reference to FIGS. 3 and 4.

The start-up control circuit 120 may be configured to perform a reset operation during the reset time, and generate a start-up signal CTR_ST based on the final enable signal EN_F. Although it will be described below again, the final enable signal EN_F may have an activation time point at which the reset time of the start-up control circuit 120 is provided. Therefore, the start-up control circuit 120 may generate a stable start-up signal CTR_ST while the reset time thereof is provided. The more detailed circuit configuration and operation of the start-up control circuit 120 will be described with reference to FIG. 2.

The reference voltage generation circuit 130 may be configured to generate a reference voltage V_REF based on the start-up signal CTR_ST. The reference voltage generation circuit 130 may be enabled based on the enable signal EN. The reference voltage generation circuit 130 may be implemented as a Widlar-type reference voltage generation circuit.

The current generation circuit 140 may be configured to generate a reference current I_BIAS based on the reference voltage V_REF. The voltage generation circuit 150 may be configured to generate an internal voltage V_BIAS based on the reference current I_BIAS.

The internal voltage generation circuit 100 in accordance with the present embodiment may secure the reset time of the start-up control circuit 120 by limiting the activation time point of the enable signal EN. Therefore, the start-up control circuit 120 may generate the stable start-up signal CTR_ST. Furthermore, the reference voltage generation circuit 130 may perform a stable start-up operation based on the start-up signal CTR_ST.

Hereafter, before the circuit configuration and operation of the enable control circuit 110 of FIG. 1 are described, the circuit configuration and operation of the start-up control circuit 120 of FIG. 1 will be described.

Figure 2:
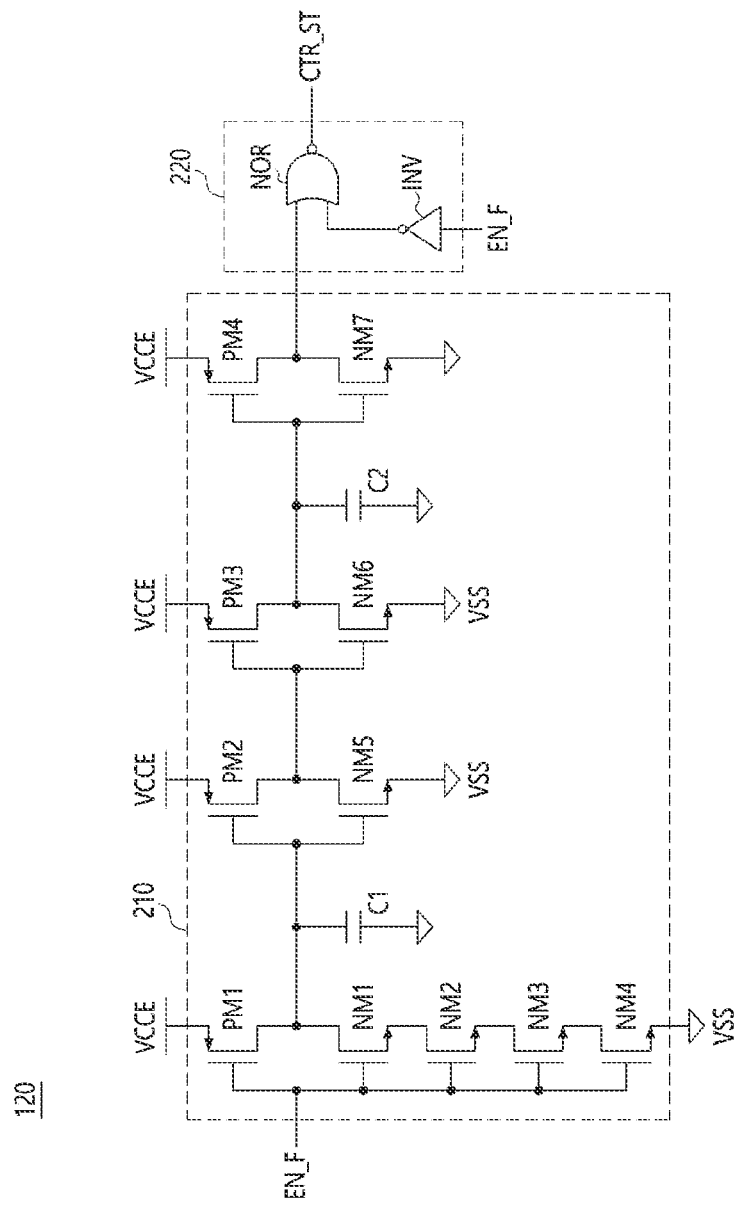
FIG. 2 is a circuit diagram illustrating a configuration of a start-up control circuit of FIG. 1.

FIG. 2 is a circuit diagram illustrating a configuration of the start-up control circuit 120 of FIG. 1.

Referring to FIG. 2, the start-up control circuit 120 may include a delay circuit 210 and an output circuit 220.

The delay circuit 210 may be configured to delay the final enable signal EN_F by a preset delay time, and output the delayed signal. Specifically, the delay circuit 210 may include first to fourth PMOS transistors PM1 to PM4, first to seventh NMOS transistors NM1 to NM7, and first and second capacitors C1 and C2.

The first PMOS transistor PM1 and the first to fourth NMOS transistors NM1 to NM4 may be coupled in series between a core voltage terminal VCCE and a ground voltage terminal VSS. The core voltage terminal VCCE may be a voltage terminal to which one of internal voltages generated based on an external supply voltage is applied. The second PMOS transistor PM2 and the fifth NMOS transistor NM5 may be coupled in series between the core voltage terminal VCCE and the ground voltage terminal VSS. The second PMOS transistor PM2 and the fifth NMOS transistor NM5 may each have a gate terminal coupled to the first capacitor C1. The third PMOS transistor PM3 and the sixth NMOS transistor NM6 may be coupled in series between the core voltage terminal VCCE and the ground voltage terminal VSS. The fourth PMOS transistor PM4 and the seventh NMOS transistor NM7 may be coupled in series between the core voltage terminal VCCE and the ground voltage terminal VSS. The fourth PMOS transistor PM4 and the seventh NMOS transistor NM7 may each have a gate terminal coupled to the second capacitor C2.

The first PMOS transistor PM1 and the first to fourth NMOS transistors NM1 to NM4 may correspond to an inverting gate. The first PMOS transistor PM1 and the first to fourth NMOS transistors NM1 to NM4 may receive the final enable signal EN_F through gate terminals thereof, invert the received final enable signal EN_F, and output the inverted signal. The second PMOS transistor PM2 and the fifth NMOS transistor NM5 may correspond to an inverting gate. The second PMOS transistor PM2 and the fifth NMOS transistor NM5 may receive an output signal of a node to which the first PMOS transistor PM1 and the first NMOS transistor NM1 are coupled in common, invert the received signal, and output the inverted signal. The third PMOS transistor PM3 and the sixth NMOS transistor NM6 may correspond to an inverting gate. The third PMOS transistor PM3 and the sixth NMOS transistor NM6 may receive an output signal of a node to which the second PMOS transistor PM2 and the fifth NMOS transistor NM5 are coupled in common, invert the received signal, and output the inverted signal. The fourth PMOS transistor PM4 and the seventh NMOS transistor NM7 may correspond to an inverting gate. The fourth PMOS transistor PM4 and the seventh NMOS transistor NM7 may receive an output signal of a node to which the third PMOS transistor PM3 and the sixth NMOS transistor NM6 are coupled in common, invert the received signal, and output the inverted signal.

The output circuit 220 may be configured to output the start-up signal CTR_ST having a pulse width corresponding to the preset delay time, based on the final enable signal EN_F and the output signal of the delay circuit 210. Specifically, the output circuit 220 may include an inverting gate INV and a NOR gate NOR.

The inverting gate INV may receive the final enable signal EN_F, invert the received signal, and output the inverted signal. The NOR gate NOR may perform a NOR operation on the output signal of the delay circuit 210 and the output signal of the inverting gate INV, and output the operation result as the start-up signal CTR_ST.

Hereafter, a simple circuit operation of the start-up control circuit 120 will be described as follows.

The start-up control circuit 120 may generate the logic 'low' start-up signal CTR_ST when the final enable signal EN_F has a logic 'low' level corresponding to an inactive state. The start-up control circuit 120 may generate the logic 'high' start-up signal CTR_ST when the final enable signal EN_F has a logic 'high' level corresponding to an active state. Then, the final enable signal EN_F may be delayed by the preset delay time through the delay circuit 210. Then, the output circuit 220 may change the logic 'high' start-up signal CTR_ST to a logic 'low' level, based on the output signal of the delay circuit 210. In other words, the start-up signal CTR_ST may transition to a logic 'high' level at a point in time when the final enable signal EN_F transitions to a logic 'high' level, and transition to a logic 'low' level after the preset delay time. That is, the start-up signal CTR_ST may have a pulse width corresponding to the preset delay time.

The start-up control circuit 120 needs to secure the reset time because the start-up signal CTR_ST is generated through an inverting delay operation on the final enable signal EN_F. The reset time may correspond to a driving time required for the delay circuit 210 to invert and delay a signal. That is, when the final enable signal EN_F is activated and then inactivated, the delay circuit 210 may perform a reset operation. At this time, each node of the delay circuit 210 may be driven to a corresponding logic level according to the reset operation. However, when the final enable signal EN_F is activated again even though the reset operation is not sufficiently completed, the start-up signal CTR_ST is not smoothly activated.

Therefore, the internal voltage generation circuit 100 in accordance with the present embodiment may include the enable control circuit 110 to secure the reset time of the start-up control circuit 120.

Figure 3:
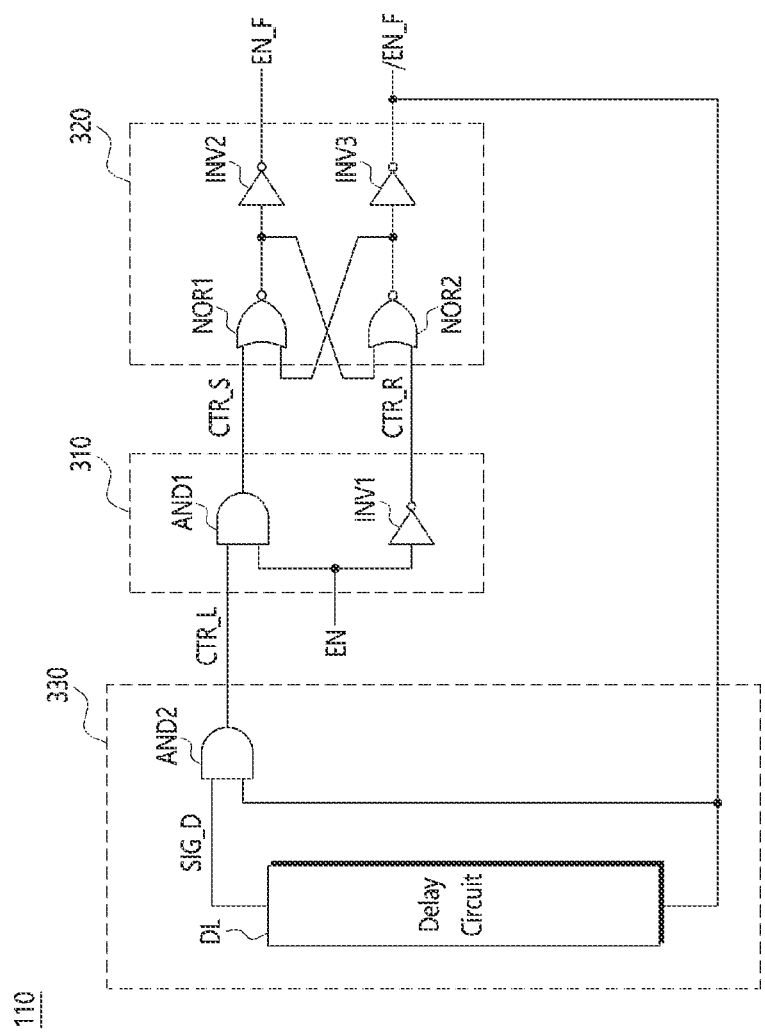
FIG. 3 is a circuit diagram illustrating a configuration of an enable control circuit of FIG. 1.

FIG. 3 is a circuit diagram illustrating the configuration of the enable control circuit 110 of FIG. 1.

Referring to FIG. 3, the enable control circuit 110 may include a signal input circuit 310, a set/reset operation circuit 320, and a signal generation circuit 330.

The signal input circuit 310 may be configured to generate a set control signal CTR_S and a reset control signal CTR_R based on the enable signal EN and a limit control signal CTR_L. Specifically, the signal input circuit 310 may include a first AND gate AND1 and a first inverting gate INV1.

The first AND gate AND1 may receive the limit control signal CTR_L and the enable signal EN, perform an AND operation on the received signals, and output the operation result as the set control signal CTR_S. The first inverting gate INV1 may receive the enable signal EN, invert the received signal, and output the inverted signal as the reset control signal CTR_R.

The set/reset operation circuit 320 may be configured to generate the final enable signal EN_F through a set/reset operation based on the set control signal CTR_S and the reset control signal CTR_R, respectively. Specifically, the set/reset operation circuit 320 may include a first NOR gate NOR1, a second NOR gate NOR2, a second inverting gate INV2, and a third inverting gate INV3.

The first NOR gate NOR1 may receive the set control signal CTR_S and an output signal of the second NOR gate NOR2, perform a NOR operation on the received signals, and output the operation result. The second NOR gate NOR2 may receive the reset control signal CTR_R and the output signal of the first NOR gate NOR1, perform a NOR operation on the received signals, and output the operation result. The second inverting gate INV2 may receive the output signal of the first NOR gate NOR1, invert the received signal, and output the inverted signal as the final enable signal EN_F. The third inverting gate INV3 may receive the output signal of the second NOR gate NOR2, invert the received signal, and output the inverted signal as the inverted final enable signal /EN_F. The final enable signal EN_F and the inverted final enable signal /EN_F may be exactly out of phase from each other.

The signal generation circuit 330 may be configured to generate the limit control signal CTR_L into which the reset time is reflected, based on the output signal of the set/reset operation circuit 320. The output signal of the set/reset operation circuit 320 may include the inverted final enable signal /EN_F. Specifically, the signal generation circuit 330 may include a delay circuit DL and a second AND gate AND2.

The delay circuit DL may be configured to delay the inverted final enable signal /EN_F by the reset time, and output the delayed signal as a delayed signal SIG_D. The second AND gate AND2 may be configured to output the limit control signal CTR_L based on the delayed signal SIG_D and the inverted final enable signal/EN_F. The second AND gate AND2 may be an output circuit to output the limit control signal CTR_L. Although it will be described below, the limit control signal CTR_L may be inactivated in a period corresponding to the reset time.

Figure 4:
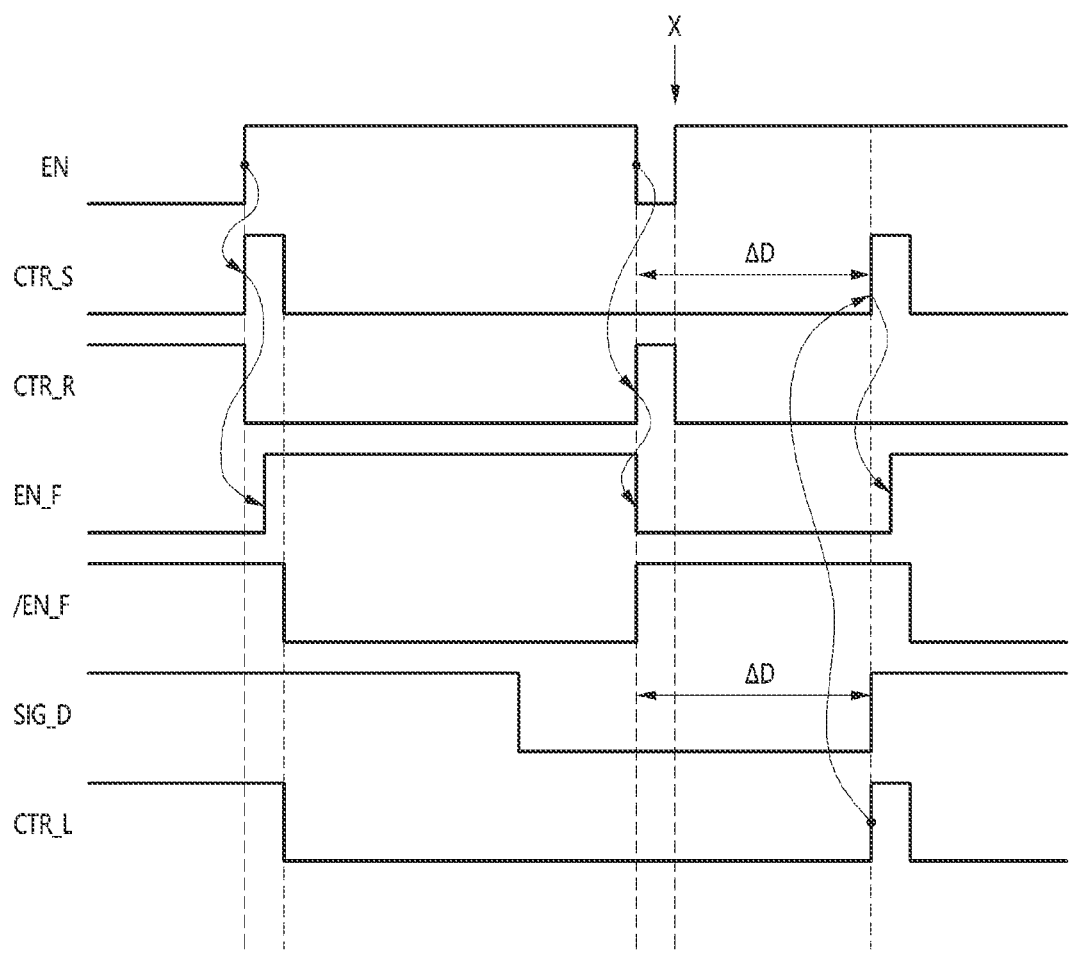
FIG. 4 is a waveform diagram illustrating a circuit operation of the enable control circuit of FIG. 3.

FIG. 4 is a waveform diagram illustrating the circuit operation of the enable control circuit 110 of FIG. 3. FIG. 4 illustrates waveforms for the circuit operation based on the enable signal EN, the set control signal CTR_S, the reset control signal CTR_R, the final enable signal EN_F, the inverted final enable signal /EN_F, the delayed signal SIG_D, and the limit control signal CTR_L.

Referring to FIGS. 3 and 4, the circuit operation of the enable control circuit 110 will be described as follows. For reference, the enable signal EN may become logic 'low' in an inactive period, and become logic 'high' in an active period.

First, when the enable signal EN is activated while transitioning to a logic 'high' level in the inactive period, the set control signal CTR_S may transition to a logic 'high' level. Therefore, the set/reset operation circuit 320 of FIG. 3 may perform the set operation to generate the final enable signal EN_F which transitions to a logic 'high' level.

Then, when the enable signal EN is inactivated while transitioning to a logic 'low' level in the active period, the reset control signal CTR_R may transition to a logic 'high' level. Therefore, the set/reset operation circuit 320 of FIG. 3 may perform the reset operation to generate the final enable signal EN_F which transitions to a logic 'low' level. At this time, the inverted final enable signal /EN_F may transition to a logic 'high' level.

The delay circuit DL of FIG. 3 may delay the inverted final enable signal /EN_F by a reset time ΔD, and output the delayed signal SIG_D. The second AND gate AND2 may generate the limit control signal CTR_L by performing an AND operation on the inverted final enable signal /EN_F and the delayed signal SIG_D. As illustrated in FIG. 4, the limit control signal CTR_L may be inactivated to a logic 'low' level in a period corresponding to the reset time ΔD.

When the enable signal EN is inactivated to a logic 'low' level, the start-up control circuit 120 may smoothly generate the start-up signal CTR_ST only in the case that the reset time ΔD thereof is provided, as described with reference to FIG. 2.

Referring back to FIG. 4, the enable signal EN may be activated to a logic 'high' level while the reset time ΔD is not secured. In FIG. 4, this state is indicated by 'X'. At this time, the limit control signal CTR_L may retain an inactive state at a logic 'low' level. Therefore, the set control signal CTR_S may not be activated during the reset time ΔD, based on the limit control signal CTR_L. Then, when the limit control signal CTR_L is activated to a logic 'high' level after the reset time ΔD, the set control signal CTR_S may be activated to a logic 'high' level. The final enable signal EN_F may be activated to a logic 'high' level based on the set control signal CTR_S. As a result, the activation time point of the enable signal EN may be limited to a time point after the reset time ΔD.

The internal voltage generation circuit 100 in accordance with the present embodiment may generate the final enable signal EN_F by limiting the activation time point of the enable signal EN to a point of time after the reset time ΔD, after the enable signal EN is inactivated. In other words, the final enable signal EN_F may provide the reset time ΔD for the start-up control circuit 120 of FIGS. 1 and 2. Therefore, the start-up control circuit 120 may generate the stable start-up signal CTR_ST based on the final enable signal EN_F.

Figure 5:
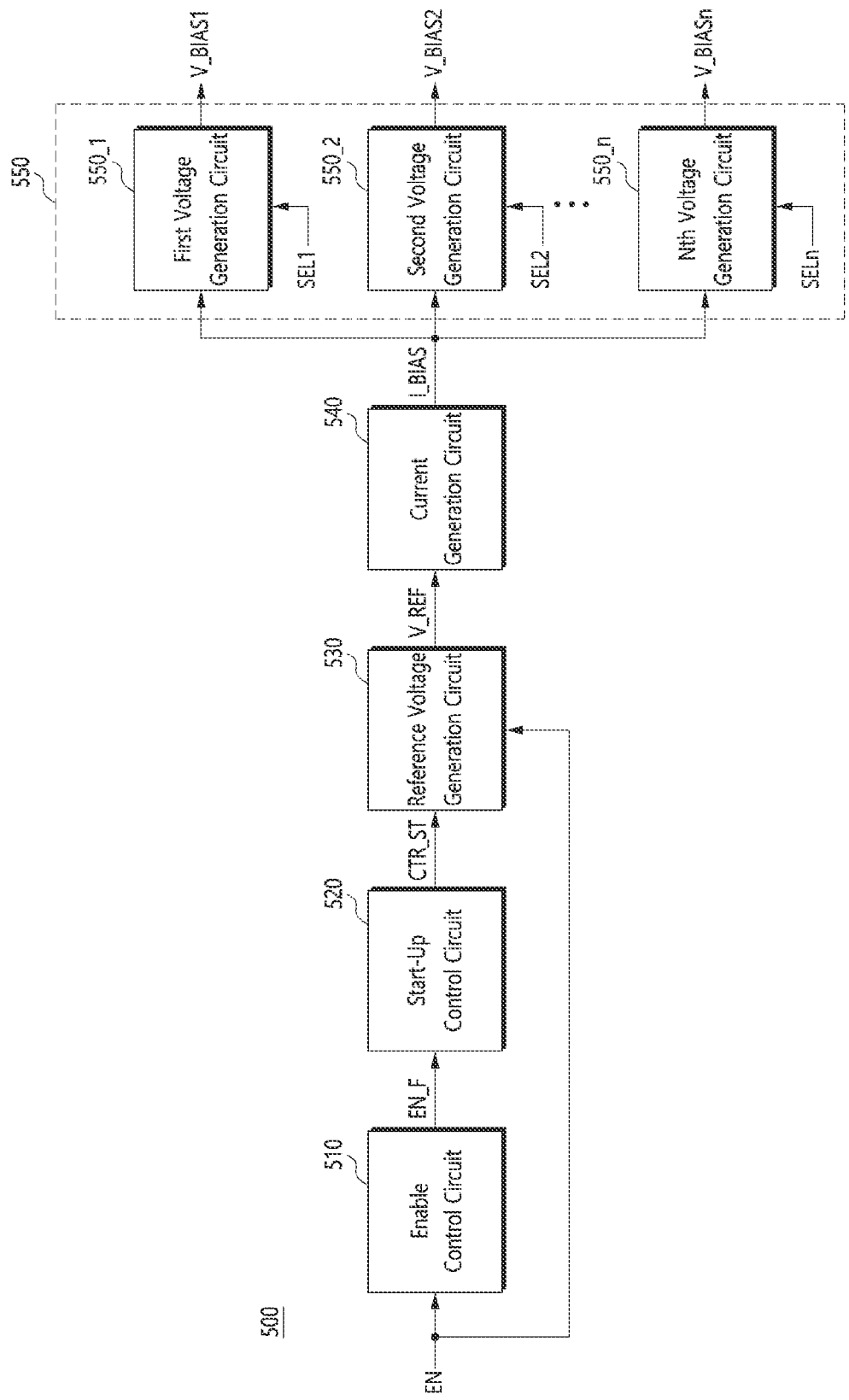
FIG. 5 is a block diagram illustrating a configuration of an internal voltage generation circuit, in accordance with an embodiment.

FIG. 5 is a block diagram illustrating a configuration of an internal voltage generation circuit 500 in accordance with an embodiment.

Referring to FIG. 5, the internal voltage generation circuit 500 may include an enable control circuit 510, a start-up control circuit 520, a reference voltage generation circuit 530, a current generation circuit 540, and a plurality of voltage generation circuits 550. The enable control circuit 510, the start-up control circuit 520, the reference voltage generation circuit 530, and the current generation circuit 540 may correspond to the enable control circuit 110, the start-up control circuit 120, the reference voltage generation circuit 130, and the current generation circuit 140 of FIG. 1, respectively.

The plurality of voltage generation circuits 550 may be configured to generate first to $n^{th}$ internal voltages V_BIAS1, ..., V_BIASn which are a plurality of internal voltages, based on a reference current I_BIAS, where n is a natural number equal to or greater than 2. The plurality of voltage generation circuits 550 may include two or more first to $n^{th}$ voltage generation circuits 550_1, ..., 550_n. The first to $n^{th}$ voltage generation circuits 550_1, ..., 550_n may convert the reference current I_BIAS into the first to $n^{th}$ internal voltages V_BIAS1, ..., V_BIASn, based on first to $n^{th}$ selection signals SEL1, ..., SELn, respectively.

The first to $n^{th}$ selection signals SEL1, ..., SELn may be signals for selectively enabling the first to $n^{th}$ voltage generation circuits 550_1, ..., 550_n, respectively. For example, the first voltage generation circuit 550_1 may convert the reference current I_BIAS into the first internal voltage V_BIAS1 based on the first selection signal SEL1. The second voltage generation circuit 550_2 may convert the reference current I_BIAS into the second internal voltage V_BIAS2 based on the second selection signal SEL2. The first internal voltage V_BIAS1 and the second internal voltage V_BIAS2 may have different voltage levels.

The internal voltage generation circuit 500 in accordance with the present embodiment may generate the first to $n^{th}$ internal voltages V_BIAS1, ..., V_BIASn based on the reference current I_BIAS generated by the current generation circuit 540.

Figure 6:
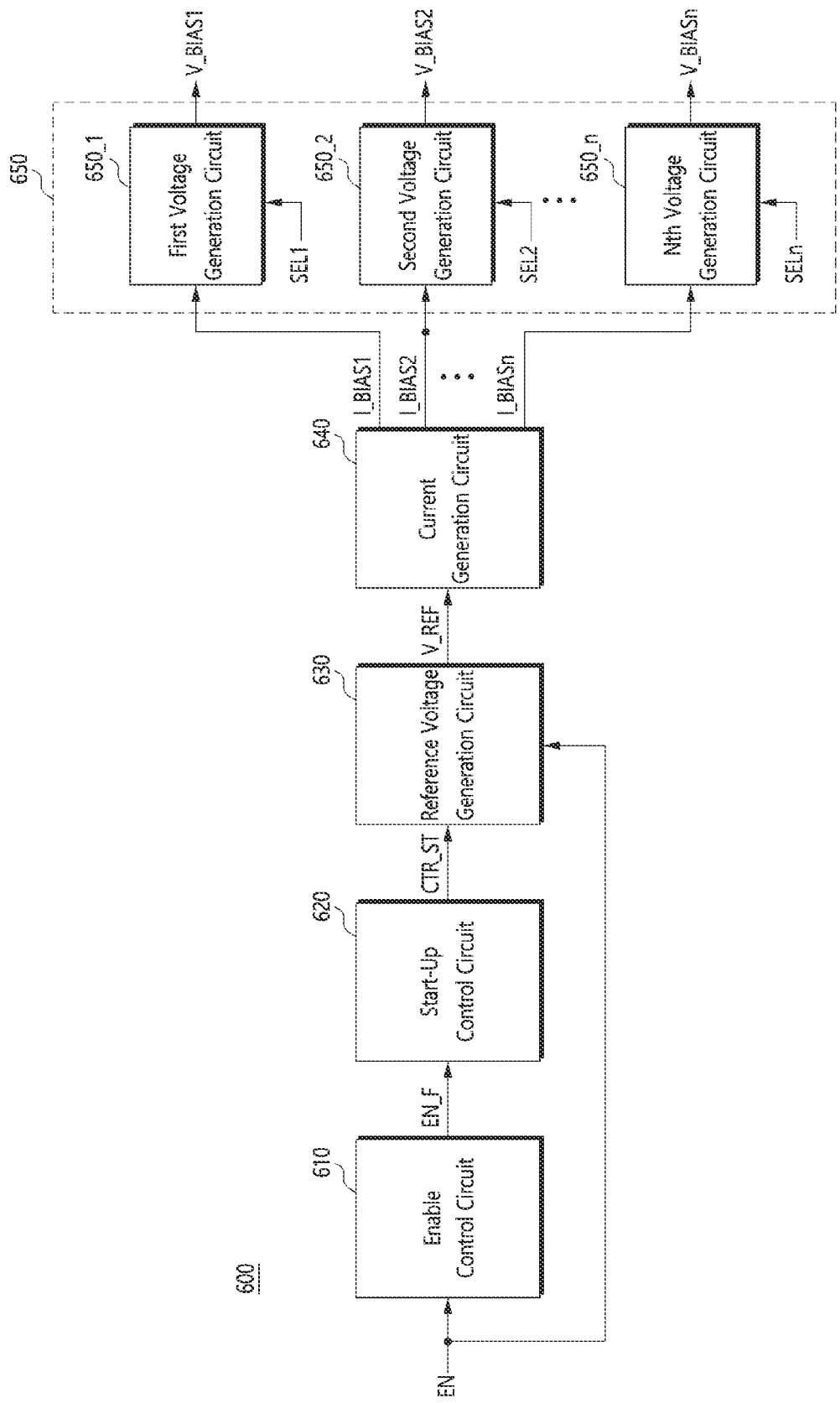
FIG. 6 is a block diagram illustrating a configuration of an internal voltage generation circuit, in accordance with an embodiment.

FIG. 6 is a block diagram illustrating a configuration of an internal voltage generation circuit 600 in accordance with an embodiment.

Referring to FIG. 6, the internal voltage generation circuit 600 may include an enable control circuit 610, a start-up control circuit 620, a reference voltage generation circuit 630, a current generation circuit 640, and a plurality of voltage generation circuits 650. The enable control circuit 610, the start-up control circuit 620, and the reference voltage generation circuit 630 may correspond to the enable control circuit 110, the start-up control circuit 120, and the reference voltage generation circuit 130 of FIG. 1, respectively.

The current generation circuit 640 may be configured to generate first to $n^{th}$ reference currents I_BIAS1, ..., I_BIASn which are a plurality of reference currents, based on a reference voltage V_REF, where n is a natural number equal to or greater than 2. The current generation circuit 640 will be described in more detail with reference to FIG. 7.

The plurality of voltage generation circuits 650 may be configured to generate first to $n^{th}$ internal voltages V_BIAS1, ..., V_BIASn which are a plurality of internal voltages corresponding to the first to $n^{th}$ reference currents I_BIAS1, ..., I_BIASn, respectively. The plurality of voltage generation circuits 650 may include two or more first to $n^{th}$ voltage generation circuits 650_1, ..., 650_n. The first to $n^{th}$ voltage generation circuits 650_1, ..., 650_n may convert the first to $n^{th}$ reference currents I_BIAS1, ..., I_BIASn into the first to $n^{th}$ internal voltages V_BIAS1, ..., V_BIASn, based on first to $n^{th}$ selection signals SEL1, ..., SELn, respectively.

The first to $n^{th}$ selection signals SEL1, ..., SELn may be signals for selectively enabling the first to $n^{th}$ voltage generation circuits 650_1, ..., 650_n, respectively. For example, the first voltage generation circuit 650_1 may convert the first reference current I_BIAS1 into the first internal voltage V_BIAS1 based on the first selection signal SEL1. The second voltage generation circuit 650_2 may convert the second reference current I_BIAS2 into the second internal voltage V_BIAS2 based on the second selection signal SEL2. The first reference current I_BIAS1 and the second reference current I_BIAS2 may have different current amounts.

The internal voltage generation circuit 600 in accordance with the present embodiment may generate the first to $n^{th}$ internal voltages V_BIAS1, ..., V_BIASn based on the first to $n^{th}$ reference currents I_BIAS1, ..., I_BIASn generated by the current generation circuit 640.

Figure 7:
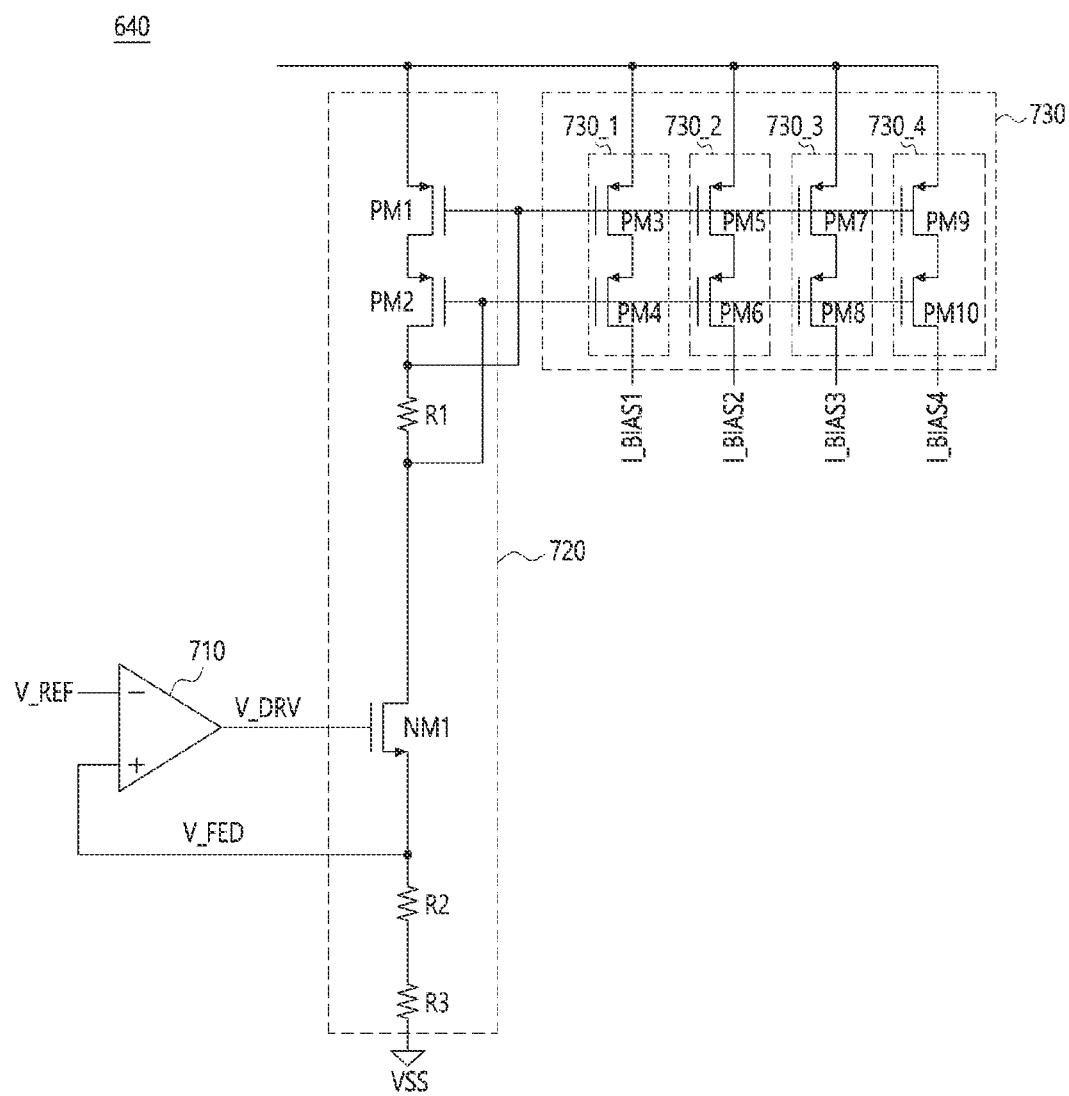
FIG. 7 is a circuit diagram illustrating a configuration of a current generation circuit of FIG. 6.

FIG. 7 is a circuit diagram illustrating a configuration of the current generation circuit 640 of FIG. 6. As described above, the current generation circuit 640 may generate the first to $n^{th}$ reference currents I_BIAS1, ..., I_BIASn which are a plurality of reference currents, based on the reference voltage V_REF. FIG. 7 illustrates that the current generation circuit 640 generates the first to fourth reference currents I_BIAS1 to I_BIAS4 corresponding to four reference currents among the plurality of reference currents.

Referring to FIG. 7, the current generation circuit 640 may include a comparison circuit 710, a current driving circuit 720, and a current output circuit 730.

The comparison circuit 710 may be configured to generate a driving voltage V_DRV by comparing the reference voltage V_REF and a feedback voltage V_FED. The comparison circuit 710 may drive the driving voltage V_DRV to a logic 'high' level when the feedback voltage V_FED is lower than the voltage level of the reference voltage V_REF.

The current driving circuit 720 may be configured to generate a driving current based on the driving voltage V_DRV. More specifically, the current driving circuit 720 may include first and second PMOS transistors PM1 and PM2, a first NMOS transistor NM1, and first to third resistors R1 to R3.

The first PMOS transistor PM1, the second PMOS transistor PM2, the first resistor R1, the first NMOS transistor NM1, the second resistor R2, and the third resistor R3 may be coupled in series between the core voltage terminal VCCE and the ground voltage terminal VSS. Among the transistors and resistors, the first NMOS transistor NM1 may receive the driving voltage V_DRV through a gate terminal thereof. When the first NMOS transistor NM1 is turned on based on the driving voltage V_DRV, the driving current may flow through the drain and source terminals of the first NMOS transistor NM1. The feedback voltage V_FED may be outputted to a node coupled between the first NMOS transistor NM1 and the second resistor R2.

The second and third resistors R2 and R3 included in the current driving circuit 720 may adjust the amount of the driving current based on temperature. The second and third resistors R2 and R3 may each have a resistance value that increases at high temperature, and decreases at low temperature. Therefore, the amount of the driving current may decrease at high temperature, and increase at low temperature.

The current output circuit 730 may be configured to output the first to fourth reference currents I_BIAS1 to I_BIAS4 based on the driving current. More specifically, the current output circuit 730 may include first to fourth current output circuits 730_1 to 730_4.

The first current output circuit 730_1 may include third and fourth PMOS transistors PM3 and PM4. The third and fourth PMOS transistors PM3 and PM4 may be coupled in series to the core voltage terminal VCCE. Gate terminals of the third PMOS transistor PM3 and the first PMOS transistor PM1 may be coupled in a current mirror type, and gate terminals of the fourth PMOS transistor PM4 and the second PMOS transistor PM2 may be coupled in a current mirror type. Therefore, the first current output circuit 730_1 may generate the first reference current I_BIAS1 corresponding to the driving current formed in the current driving circuit 720.

The second current output circuit 730_2 may include fifth and sixth PMOS transistors PM5 and PM6. Gate terminals of the fifth PMOS transistor PM5 and the first PMOS transistor PM1 may be coupled in a current mirror type, and gate terminals of the sixth PMOS transistor PM6 and the second PMOS transistor PM2 may be coupled in a current mirror type. Therefore, the second current output circuit 730_2 may generate the second reference current I_BIAS2 corresponding to the driving current.

The third and fourth PMOS transistors PM3 and PM4 of the first current output circuit 730_1 may have a different resistance ratio from the fifth and sixth PMOS transistors PM5 and PM6 of the second current output circuit 730_2. Therefore, the first reference current I_BIAS1 and the second reference current I_BIAS2 may have different current amounts.

Seventh and eighth PMOS transistors PM7 and PM8 of the third current output circuit 730_3 and ninth and tenth PMOS transistors PM9 and PM10 of the fourth current output circuit 730_4 may be configured in a similar manner to those of the first current output circuit 730_1. Thus, the third current output circuit 730_3 may generate the third reference current I_BIAS3, and the fourth current output circuit 730_4 may generate the fourth reference current I_BIAS4.

Figure 8:
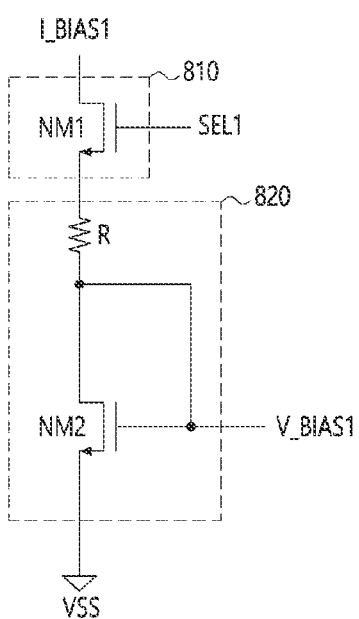
FIG. 8 is a circuit diagram illustrating a configuration of a first voltage generation circuit of FIG. 6.

FIG. 8 is a circuit diagram illustrating the configuration of the first voltage generation circuit 650_1 of FIG. 6.

Referring to FIG. 8, the first voltage generation circuit 650_1 may include an input circuit 810 and an output circuit 820.

The input circuit 810 may be configured to receive the first reference current I_BIAS1 based on the first selection signal SEL1. The input circuit 810 may include a first NMOS transistor NM1. The first NMOS transistor NM1 may receive the first selection signal SEL1 through a gate terminal thereof. Therefore, when the first selection signal SEL1 becomes logic 'low', the input circuit 810 may receive the first reference current I_BIAS1 and provide the received signal to the output circuit 820 which will be described below.

The output circuit 820 may be configured to output the first internal voltage V_BIAS1 based on the output current provided by the input circuit 810. The output circuit 820 may include a resistor R and a second NMOS transistor NM2. The first internal voltage V_BIAS1 may be outputted to a node coupled between the resistor R and the second NMOS transistor NM2.

Through the above-described configuration, the first voltage generation circuit 650_1 may convert the first reference current I_BIAS1 into the first internal voltage V_BIAS1 based on the first selection signal SEL1. Although not illustrated in the drawings, the second to fourth voltage generation circuits 650_2 to 650_4 may each have a similar configuration to the first voltage generation circuit 650_1 described with reference to FIG. 8. Therefore, the second to fourth voltage generation circuits 650_2 to 650_4 may convert the second to fourth reference currents I_BIAS2 to I_BIAS4 into the second to fourth internal voltages V_BIAS2 to V_BIAS4 based on the second to fourth selection signals SEL2 to SEL4, respectively.

The first to fourth selection signals SEL1 to SEL4 may each have a short inactive period like the enable signal EN. However, the first to fourth voltage generation circuits 650_1 to 650_4 which are driven based on the first to fourth selection signals SEL1 to SEL4 does not require the reset operation. Therefore, although the first to fourth selection signals SEL1 to SEL4 each have a short inactive period, the first to fourth voltage generation circuits 650_1 to 650_4 may generate the stable first to fourth internal voltages V_BIAS1 to V_BIAS4.

Figure 9:
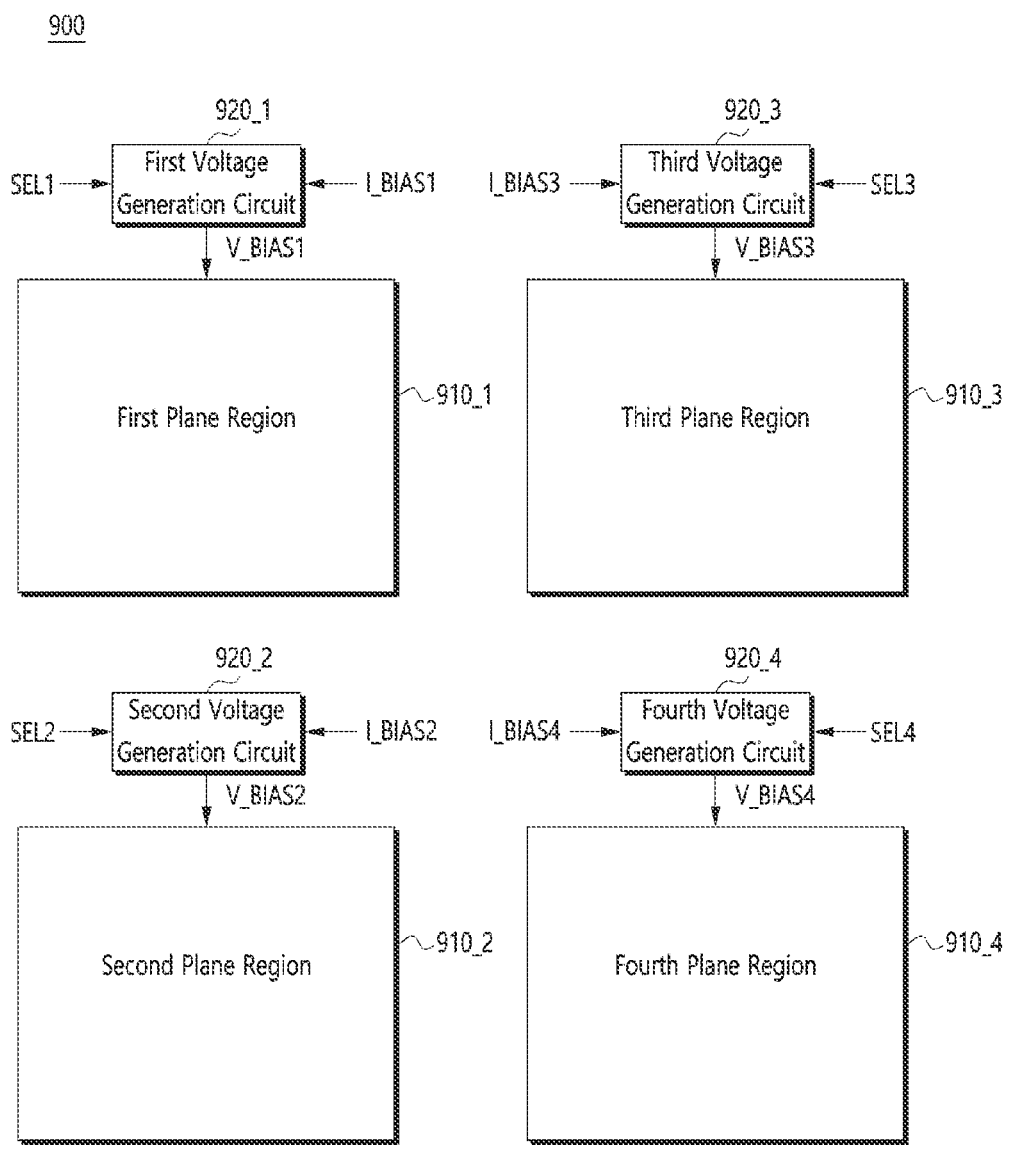
FIG. 9 is a block diagram illustrating a configuration of a semiconductor memory apparatus, in accordance with an embodiment.

FIG. 9 is a block diagram illustrating a configuration of a semiconductor memory apparatus 900, in accordance with an embodiment. The case in which the internal voltage generation circuit 600 of FIGS. 6 and 7 is applied to the semiconductor memory apparatus 900 of FIG. 9 will be taken as an example.

Referring to FIG. 9, the semiconductor memory apparatus 900 may include first to fourth plane regions 910_1 to 910_4 which are a plurality of plane regions. The first to fourth plane regions 910_1 to 910_4 may each include a memory bank. The first to fourth plane regions 910_1 to 910_4 may each perform an interleaving operation.

The semiconductor memory apparatus 900 may include first to fourth voltage generation circuits 920_1 to 920_4 which are a plurality of voltage generation circuits. The first to fourth voltage generation circuits 920_1 to 920_4 of FIG. 9 may correspond to the first to fourth voltage generation circuits 650_1 to 650_4 described with reference to FIG. 8, respectively.

In other words, the first plane region 910_1 may receive the first internal voltage V_BIAS1 which is generated by the first voltage generation circuit 920_1, the second plane region 910_2 may receive the second internal voltage V_BIAS2 which is generated by the second voltage generation circuit 920_2, the third plane region 910_3 may receive the third internal voltage V_BIAS3 which is generated by the third voltage generation circuit 920_3, and the fourth plane region 910_4 may receive the fourth internal voltage V_BIAS4 which is generated by the fourth voltage generation circuit 920_4. Therefore, the first to fourth plane regions 910_1 to 910_4 may perform read and write operations on data, for example, based on the first to fourth internal voltages V_BIAS1 to V_BIAS4.

As described with reference to FIG. 8, each of the first to fourth voltage generation circuits 650_1 to 650_4 may include the first and second NMOS transistors NM1 and NM2 and the resistor R. That is, the first to fourth voltage generation circuits 650_1 to 650_4 may be designed to have a very small area. Therefore, it is possible to reduce or minimize the circuit area of the semiconductor memory apparatus 900 capable of performing a stable operation on the first to fourth plane regions 910_1 to 910_4.

In accordance with the present embodiments, the internal voltage generation circuit can generate a stable internal voltage.

Furthermore, it is possible to reduce or minimize the circuit area of the internal voltage generation circuit included in the semiconductor memory apparatus.

While various embodiments have been described above, it will be understood by those skilled in the art that the embodiments described are examples only. Accordingly, the internal voltage generation circuit and the semiconductor memory apparatus including the same, which are described herein, should not be limited based on the described embodiments.

What is claimed is:
1. A semiconductor integrated circuit, comprising:
    a plurality of planes, each of the planes including at least one memory bank; and
    an internal voltage generation block individually providing an internal voltage to each of the plurality of planes,
    wherein the internal voltage generation block includes:
    an enable control circuit configured to generate a final enable signal by delaying a re-enable timing of an enable signal;
    a start-up control circuit configured to generate a start-up signal to perform a reset operation during a reset time using a delayed final enable signal;
    a reference voltage generation circuit configured to generate a reference voltage using the start-up signal; and
    a voltage generation circuit configured to generate a plurality of internal voltages applied to each of the plurality of planes based on the reference voltage,
    wherein the start-up control circuit includes:
    a delay circuit configured to generate the delayed final enable signal by delaying the final enable signal by a preset delay time; and
    an output circuit configured to output the start-up signal having a pulse width corresponding to the preset delay time, based on the delayed final enable signal.
2. The semiconductor integrated circuit according to claim 1, wherein the enable control circuit is configured to re-enable the enable signal after a reset time has elapsed.
3. The internal voltage generation circuit according to claim 1, wherein the enable control circuit comprises:
    a signal input circuit configured to generate a set control signal and a reset control signal based on the enable signal and a limit control signal;
    a set/reset operation circuit configured to generate the final enable signal through a set/reset operation based on the set control signal and the reset control signal, respectively; and
    a signal generation circuit configured to generate the limit control signal, into which a reset time is reflected, based on an output signal of the set/reset operation circuit.

4. The internal voltage generation circuit according to claim 3, wherein the signal generation circuit comprises:
   a delay circuit configured to delay the output signal of the set/reset operation circuit by the reset time, and output the delayed signal; and
   an output circuit configured to output the limit control signal based on the delayed signal and the output signal of the set/reset operation circuit.

5. The internal voltage generation circuit according to claim 3, wherein the signal generation circuit is configured to inactivate the limit control signal in a period corresponding to the reset time.

6. The internal voltage generation circuit according to claim 1, wherein the internal voltage generation block further comprises a current generation circuit configured to generate a plurality of reference currents based on the reference voltage.

7. The internal voltage generation circuit according to claim 1, where the internal voltage generation block further comprises a current generation circuit, the current generation circuit comprising:
   a comparison circuit configured to generate a driving voltage by comparing the reference voltage and a feedback voltage;
   a current driving circuit configured to generate a driving current based on the driving voltage; and
   a current output circuit configured to output the plurality of reference currents based on the driving current.

8. The internal voltage generation circuit according to claim 7, wherein the current driving circuit is configured to adjust the amount of the driving current based on temperature.

* * * * *